United States Patent [19]

Lin

[11] Patent Number: 5,014,163

[45] Date of Patent: May 7, 1991

[54] STRUCTURE OF CIRCUIT BOARD ASSEMBLY

[76] Inventor: John Lin, 5F., No. 15-1, Feng Tse Wei St., San Chung City, Taipei Hsien, Taiwan

[21] Appl. No.: 472,499

[22] Filed: Jan. 30, 1990

[51] Int. Cl.⁵ .............................................. H05K 1/14
[52] U.S. Cl. ................................... 361/415; 361/413; 361/419; 361/420; 439/717
[58] Field of Search ............... 361/393, 394, 396, 417, 361/419, 420, 413, 416; 439/717, 710, 712, 715

[56] References Cited

U.S. PATENT DOCUMENTS 3,327,173 6/1967 Thompson ........................ 361/419
4,423,465 12/1983 Teng-Ching et al. ............. 361/394

FOREIGN PATENT DOCUMENTS 1232356 10/1960 France ............................... 439/717

Primary Examiner—Leo P. Picard
Assistant Examiner—Donald A. Sparks
Attorney, Agent, or Firm—Varndell Legal Group

[57] ABSTRACT

A circuit board assembly which is flexibly set up in horizontal, vertical, horizontal/vertical, and N-dimensional directions according to requirements, by means of the connection of basic solderless circuit boards, which comprises each four raised dovetail strips on its four vertical sides, via one or more double-sided connecting members, which comprise each two opposite dovetail grooves, one or more four-sided connecting members, which comprise each four dovetail grooves on its four sides, and/or one or more dovetail grooved clampings, which comprise each at least a dovetail groove and at least a corrugated hole.

16 Claims, 14 Drawing Sheets

STRUCTURE OF CIRCUIT BOARD ASSEMBLY

BACKGROUND AND SUMMARY OF THE INVENTION

The present invention relates to circuit boards and more particularly to a circuit board assembly which can be conveniently, flexibly set up according to purpose and requirement, and is compatible with interfaced network of computer.

Following the fast development in technology, the demand for breadboard for electronic circuit designing of logic training purposes is getting more and more critical. In addition to quality, flexibility and applicability have now become of great concern to an electronic circuit designer or any people who teaches or learns to design electronic circuits. As a consequence, the various known designs of breadboard can no longer fully satisfy the demand.

FIG. 1 illustrates a kind of logic training board assembly according to a prior art, which can be flexibly built up in a desired size longitudinally and laterally by means of dovetail joint. However, its expansion during assembly is limited to horizontal direction. Further, its limited applicability can not satisfy for practical use.

It is therefore, the main object of the present invention to provide a circuit board assembly which is practical in use and can eliminate the disadvantages of the aforesaid prior art.

Another object of the present invention is to provide a circuit board assembly which can be flexibly built up in a desired size and structure in horizontal, vertical, horizontal/vertical, and N-dimensional directions.

Still another object of the present invention is to provide a circuit board assembly which is compatible with an interfaced network of computer.

BRIEF DESCRIPTION OF THE DRAWINGS

FIG. 5-1 is a front view of a dovetail-grooved connecting member according to the present invention which comprises dovetail grooves for the connection thereto respectively of a raised dovetail strips of a basic solderless circuit board of the present invention, and corrugated holes for clamping circuit boards.

FIGS. 6, 6-1 and 6-2 illustrate various board assemblies in which basic solderless circuit boards are connected horizontally, vertically, or horizontally and vertically by means of double-sided connecting members.

FIGS. 7 and 7-1 illustrate two board assemblies in which basic solderless circuit boards are respectively connected by means of double-sided as well as four-sided connecting members.

FIG. 9-1 illustrates an explanatory card which has a circuit diagram marked thereon.

FIG. 9-2 illustrates an explanatory card which has explanatory marks marked thereon.

FIG. 9-3 is a schematic drawing, illustrating several explanatory cards mounted on a dovetail grooved clamping member connected to a basic solderless circuit board.

FIG. 10-1 illustrates a circuit board assembly according to the present invention, in which a circuit board which has mini components mounted thereon is secured to two basic solderless circuit boards for test.

FIG. 12-1 is a perspective view illustrating the arrangement of a plug pin on various terminals.

DETAILED DESCRIPTION OF THE PREFERRED EMBODIMENTS

Figure 1:
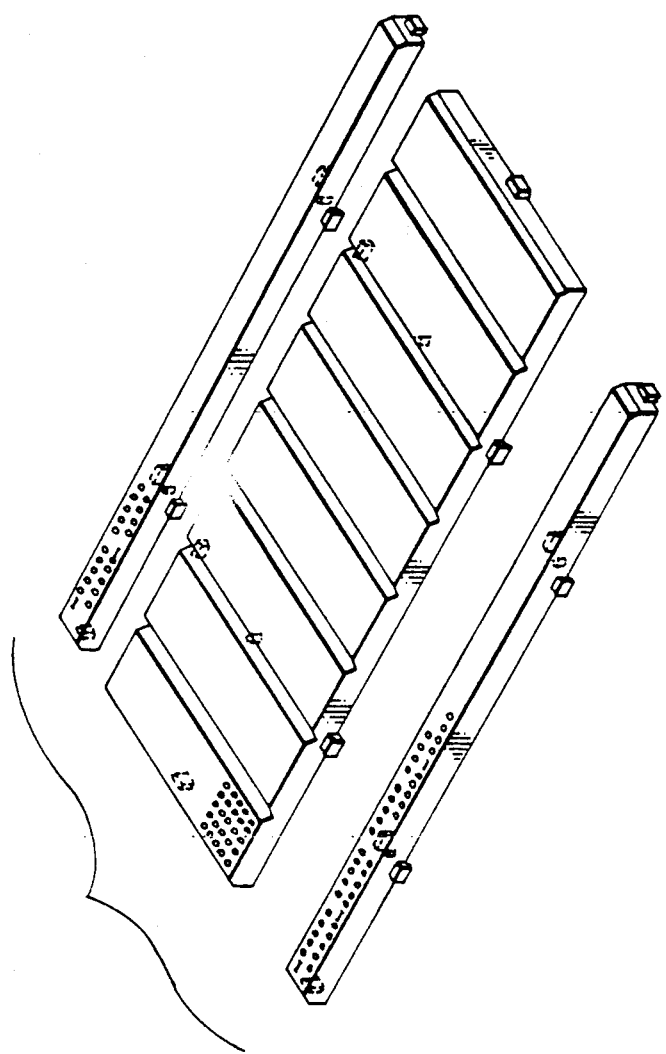
FIG. 1 is a fragmentary perspective view of a circuit board assembly according to the prior art.

Turing now to the annexed drawings in greater detail and referring first to FIGS. 2 through 5, there is a basic solderless circuit board 1 in accordance with the present invention, which is generally in a rectangular shape having a raised dovetail strip 11 each on its four vertical sides for the connection thereto of a double-sided connecting member 2 which has two opposite dovetail grooves 21, a four-sided connecting member 3 which has four dovetail grooves 31 on its four sides, or a dovetail grooved clamping member 4 which has dovetail grooves 41 in quarter turn, by means of dovetail joint.

Figure 2:
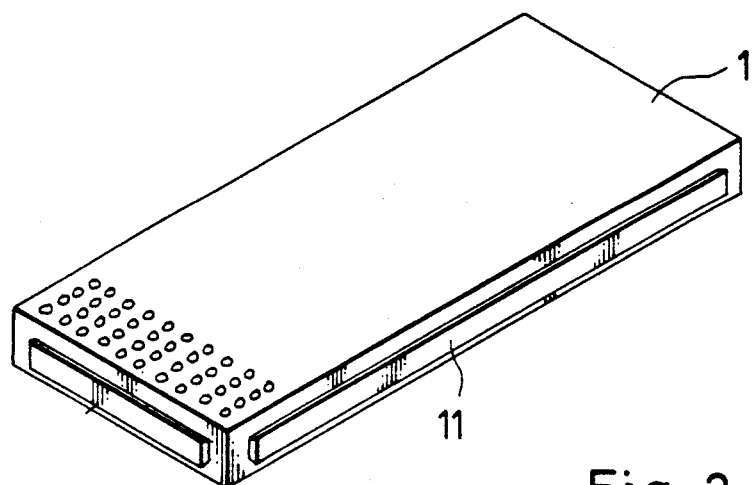
FIG. 2 is a perspective view of a basic solderless circuit board according to the present invention.
Figure 3:
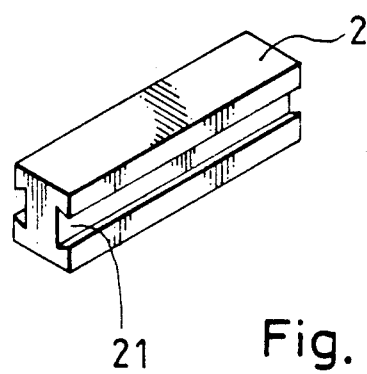
FIG. 3 is a perspective view of a connecting member according to the present invention which comprises two opposite dovetail grooves.
Figure 4:
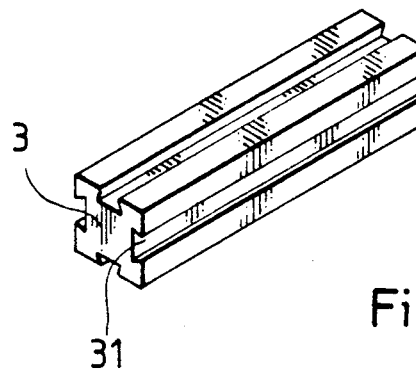
FIG. 4 is a perspective view of an alternate form of connecting member according to the present invention which comprises four devetail grooves respectively on its four sides.
Figure 5:
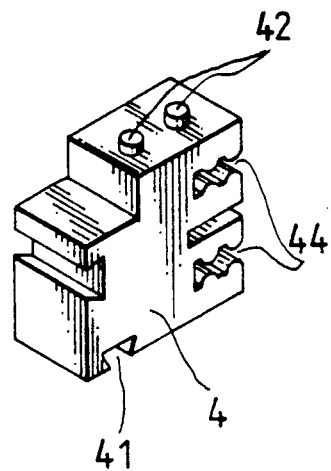
FIG. 5 is a perspective view of a dovetail-grooved connecting member according to the present invention which comprises dovetail grooves for the connection thereto respectively of a raised dovetail strips of a basic solderless circuit board of the present invention, and corrugated holes for clamping circuit boards.
Figures 1, 5:
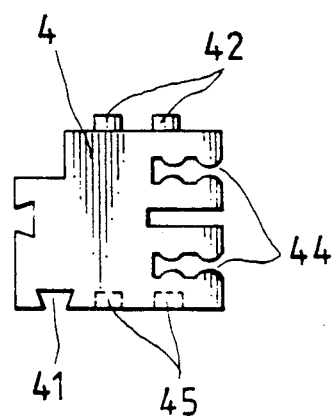
Figure 6:
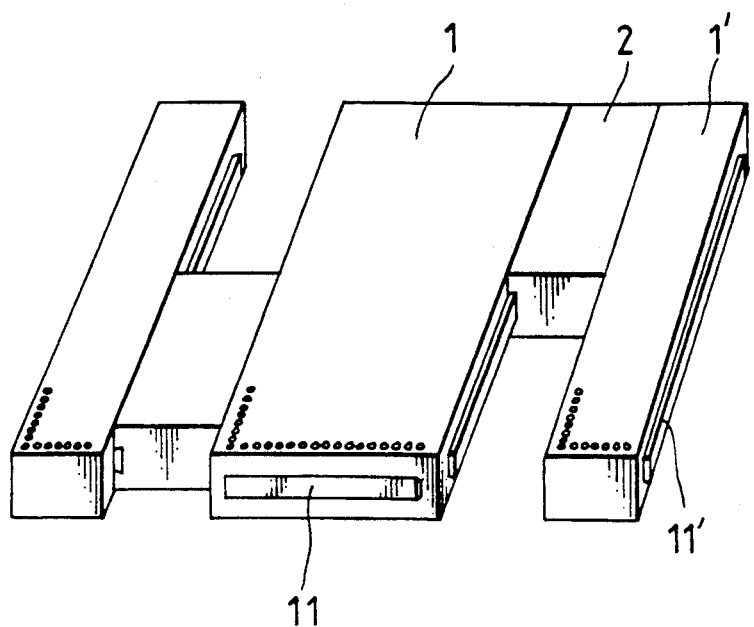
Figures 1, 6:
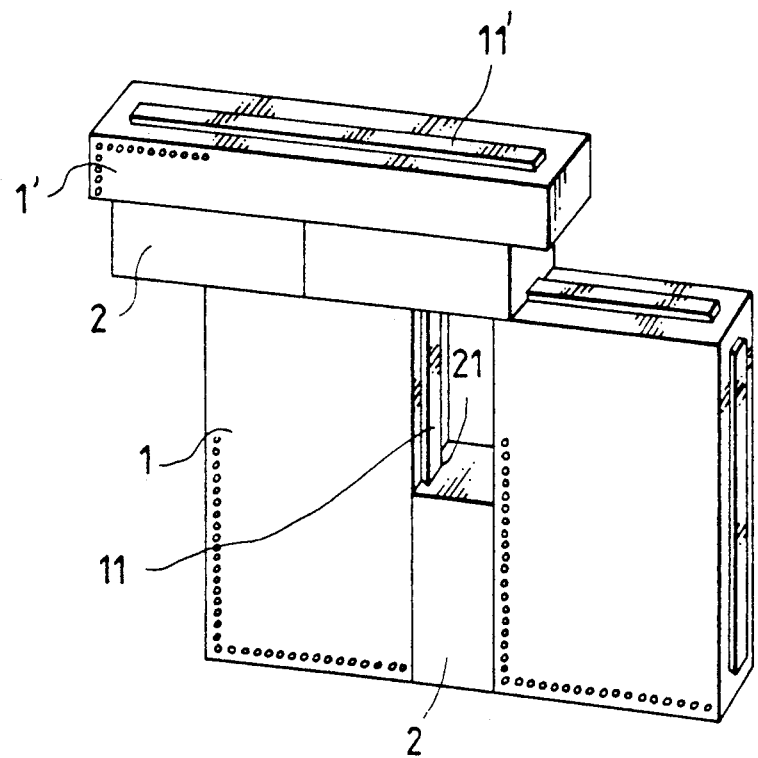
Figures 2, 6:
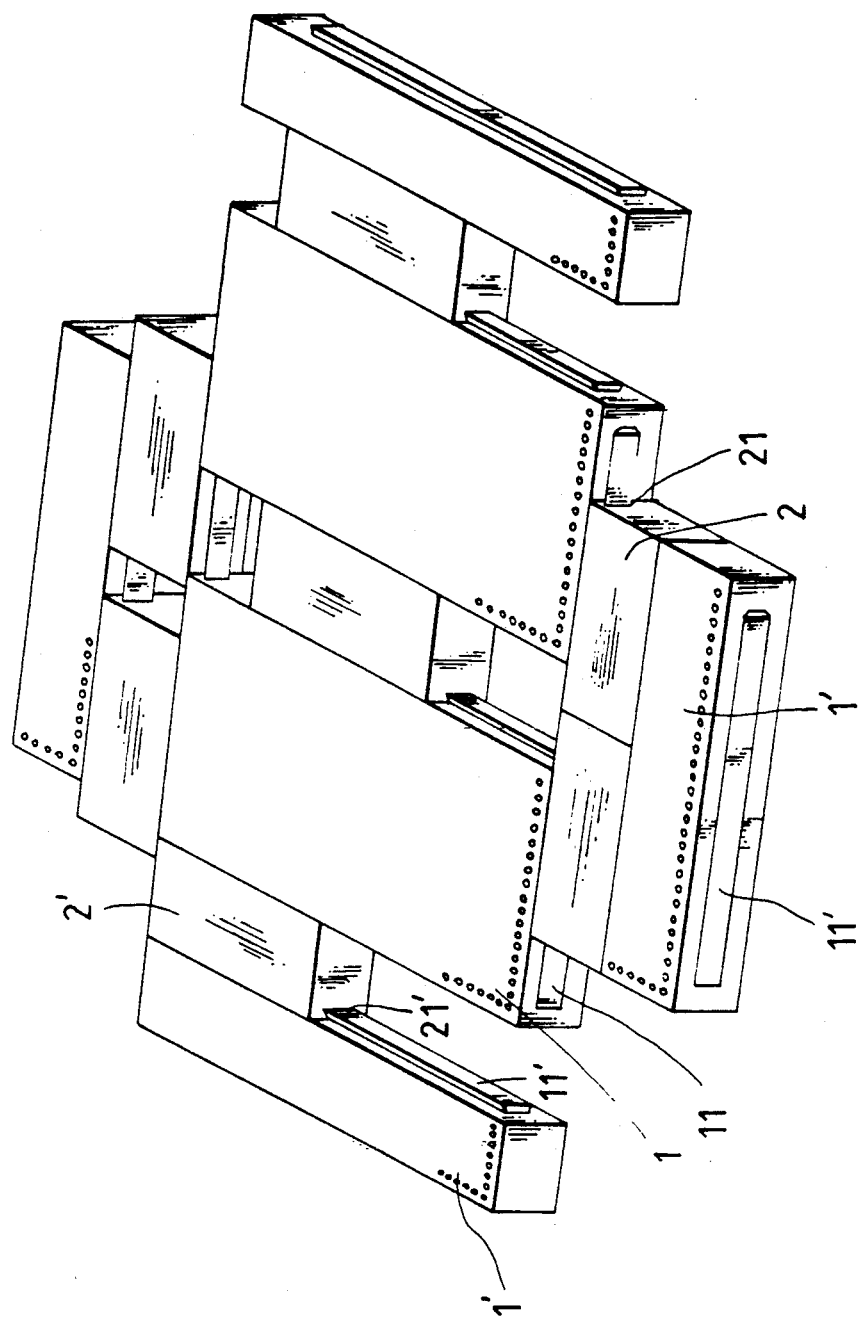

Referring to FIGS. 6, 6-1 and 6-2, basic solderless circuit boards 1, 1' are connected in horizontal, vertical, horizontal/vertical, and N-dimensional directions by means of double-sided connecting members 2, 2' with the raised dovetail strips 11, 11' of such basic solderless circuit boards 1, 1' respectively secured in the dovetail grooves 21, 21' of such double-sided connecting member 2, 2' to form a variety of circuit assemblies.

Figure 7:
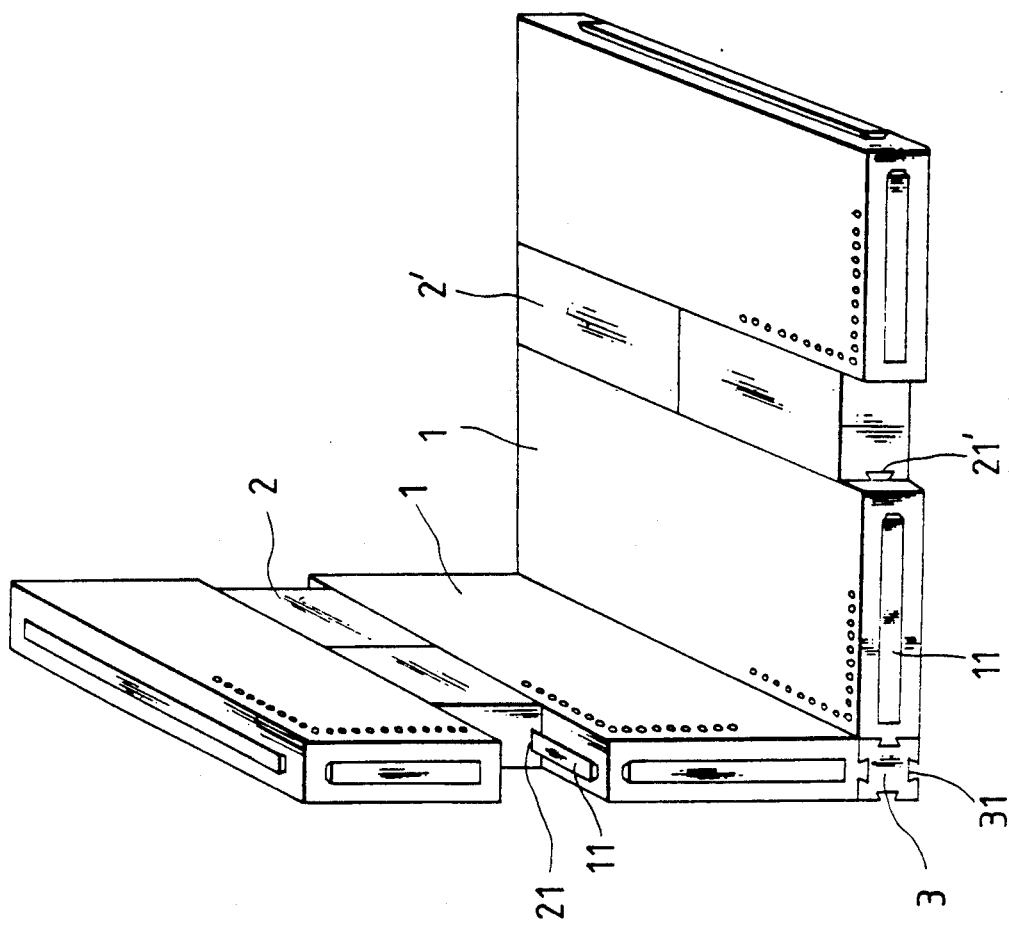
Figures 1, 7:
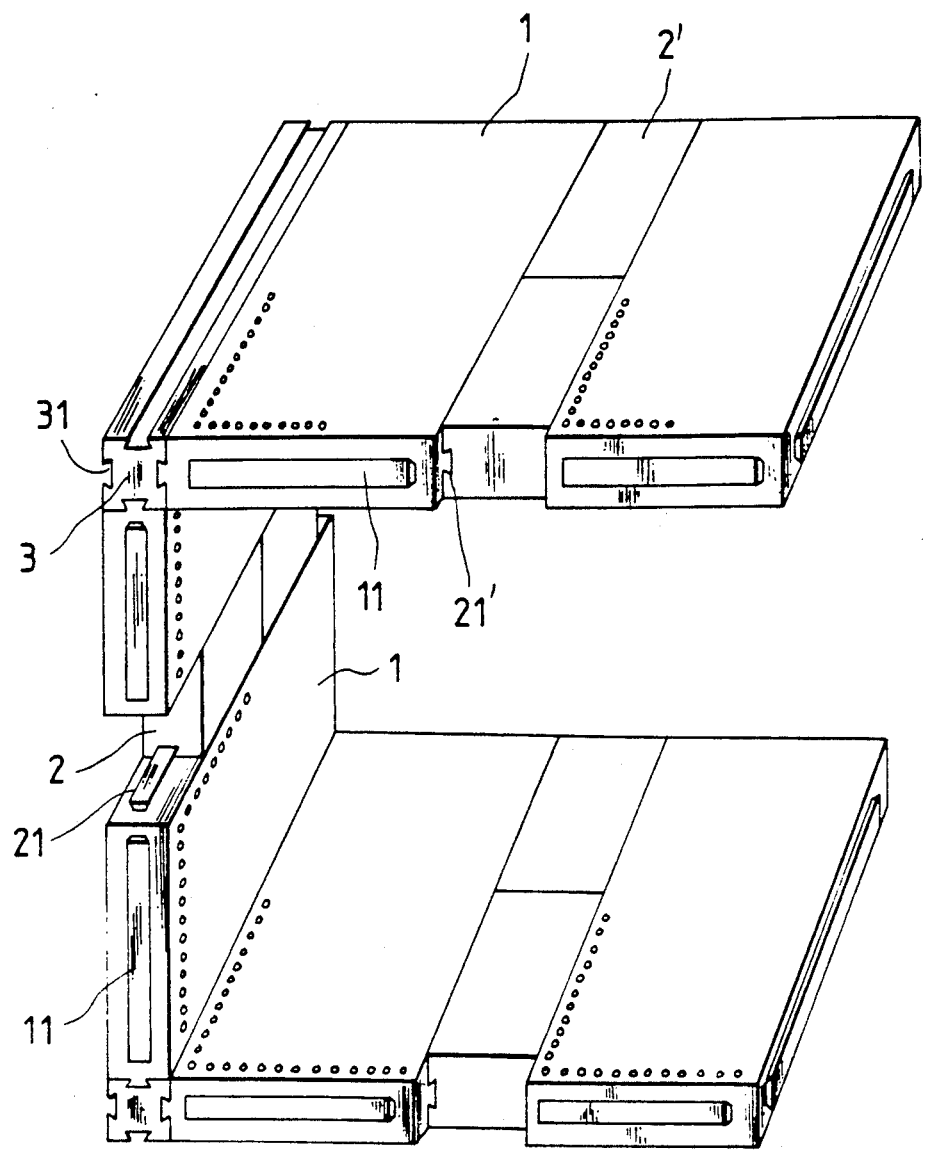

Referring to FIGS. 7 and 7-1, a circuit board assembly can be set up in N-dimension by means of the use of four-sided connecting members 3 to connect a plurality of basic solderless circuit boards 1, 1'.

Figure 8:
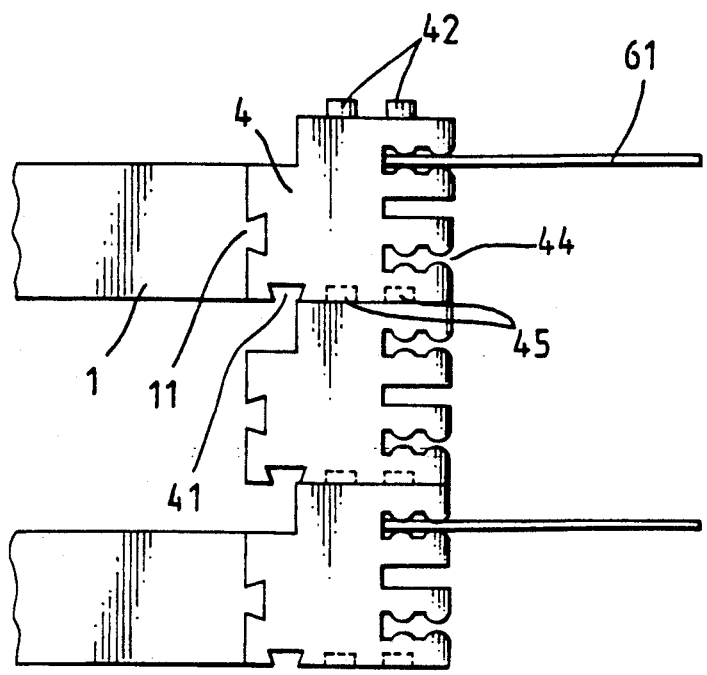
FIG. 8 illustrates a board assembly, in which dovetail grooved connecting members are connected vertically for securing basic solderless circuit boards and printed circuit boards.

Referring to FIG. 8, a dovetail grooved clamping member 4 of the present invention comprises two dowels 42 upstanding from its top surface, two dowel holes 45 on its bottom surface, one dovetail groove 41 on its bottom surface and another dovetail groove 41 on its left side-wall, two corrugated holes 44 on its right side-wall. An opening is made on the right side-wall of the dovetail grooved connecting member 4 to separate the two corrugated holes 44 so that the two corrugated holes 44 can be resiliently used as clamping means for clamping circuit boards or other things. As illustrated in FIG. 8, several dovetail grooved clamping members 4 are vertically connected together with the dowels 42 of one dovetail grooved connecting member 4 fastened in the dowel holes 45 of another, such that basic solderless circuit boards 1, 1' can be secured in the dovetail grooves 41 and printed circuit boards 61 can be fastened in the corrugated holes 44.

According to the present invention, a basic solderless circuit board 1, a double-sided connecting member 2, a four-sided connecting member 3 and a dovetail grooved connecting member 4 can be variously embodied and made in a variety of size to extend the flexibility in assembly. For better understanding of the applicability of the present invention, some examples are outlined hereinafter.

Figure 9:
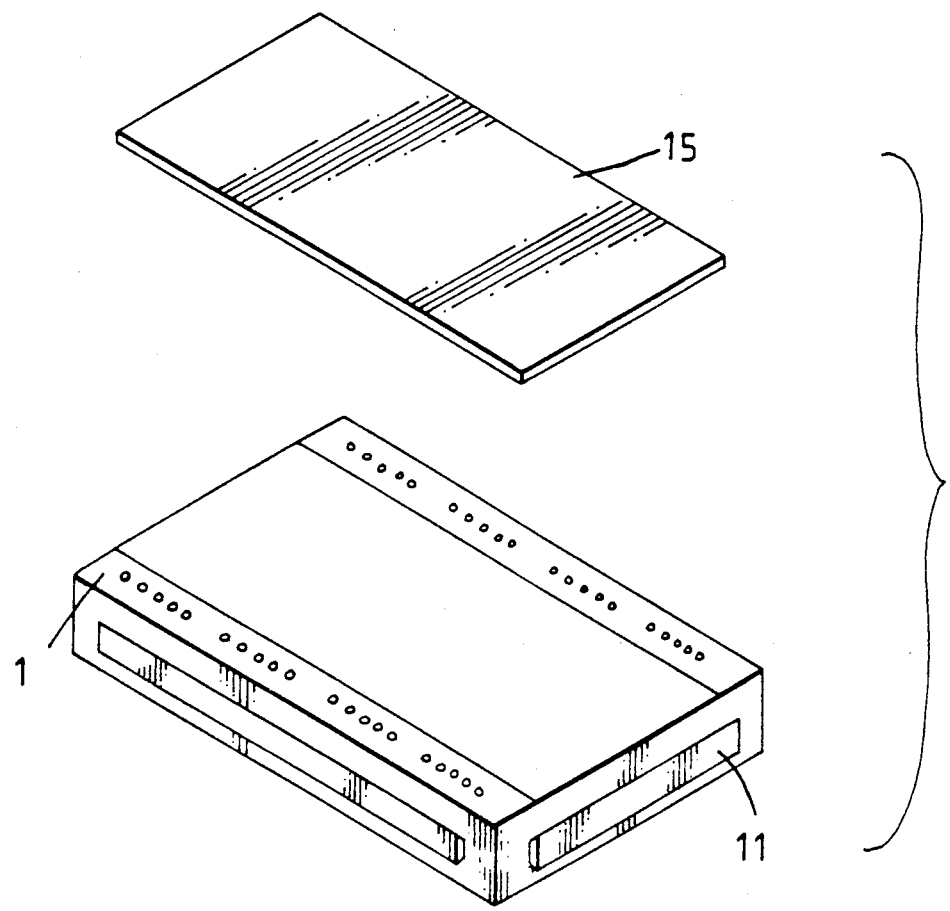
FIG. 9 is a schematic drawing illustrating the mounting of an explanatory card on a basic solderless circuit board.
Figures 1, 9:
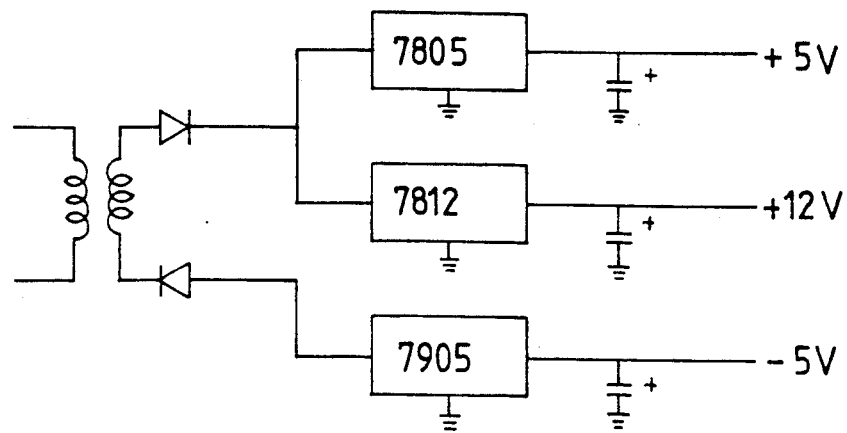
Figures 2, 9:
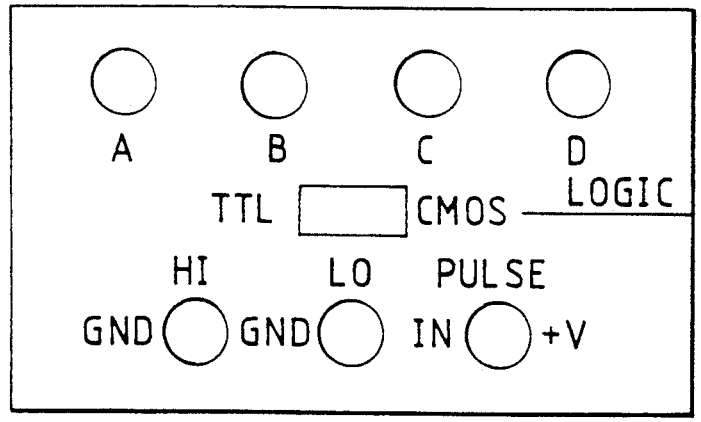
Figures 3, 9:
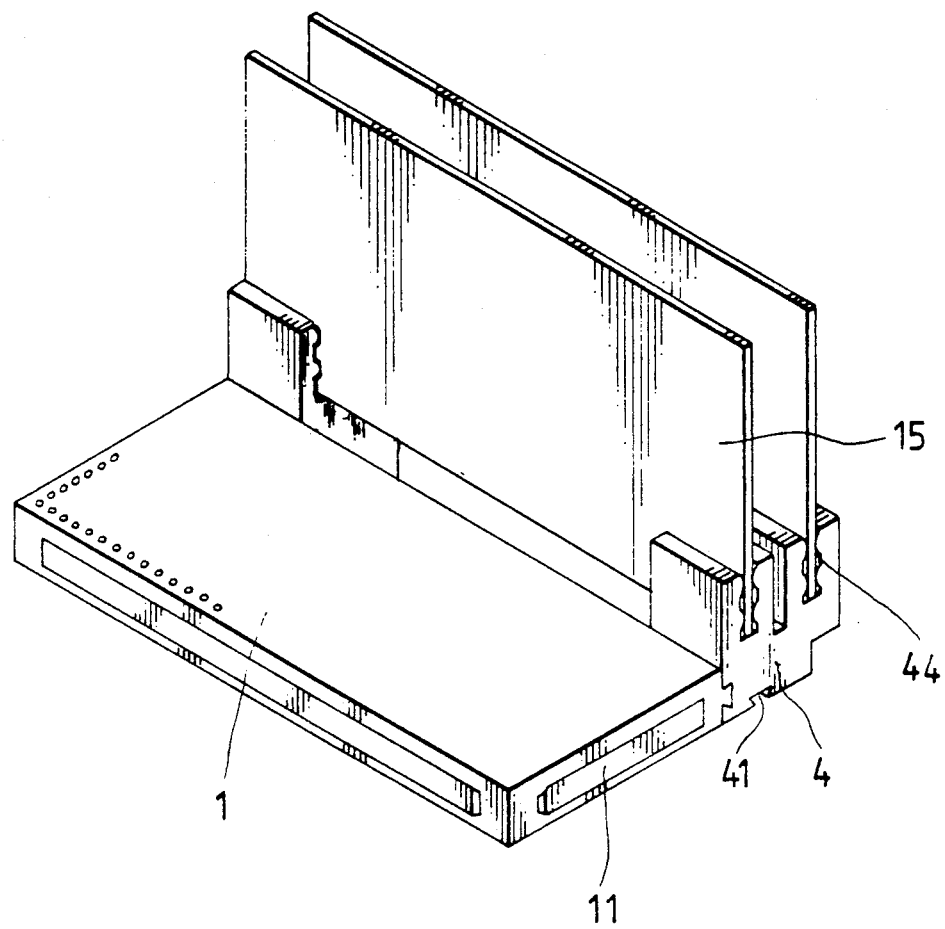

1. As illustrated in FIG. 9, an explanatory card 15 may be movably or fixedly fastened in a basic solderless circuit board 1. According to the present invention, an explanatory card 15 may be printed with a circuit diagram (see FIG. 9-1) or explanatory drawing or marks (see FIG. 9-2) to help logic training or experimentation. A variety of explanatory cards 15 may be vertically fastened in the corrugated holes 44 of several dovetail grooved connecting members 4 which are connected together to horizontally secure a basic solderless circuit boards 1 (see FIG. 9-3). Under this arrangement, explanation or marks can be marked on the vertically disposed multi-use component cards 15 to facilitate experimentation.

2. Marks, characters, signs, circuit diagrams can be directly marked on a basic solderless circuit board of the present invention to make learning, test, repair and trouble shooting easy.

Figure 14:
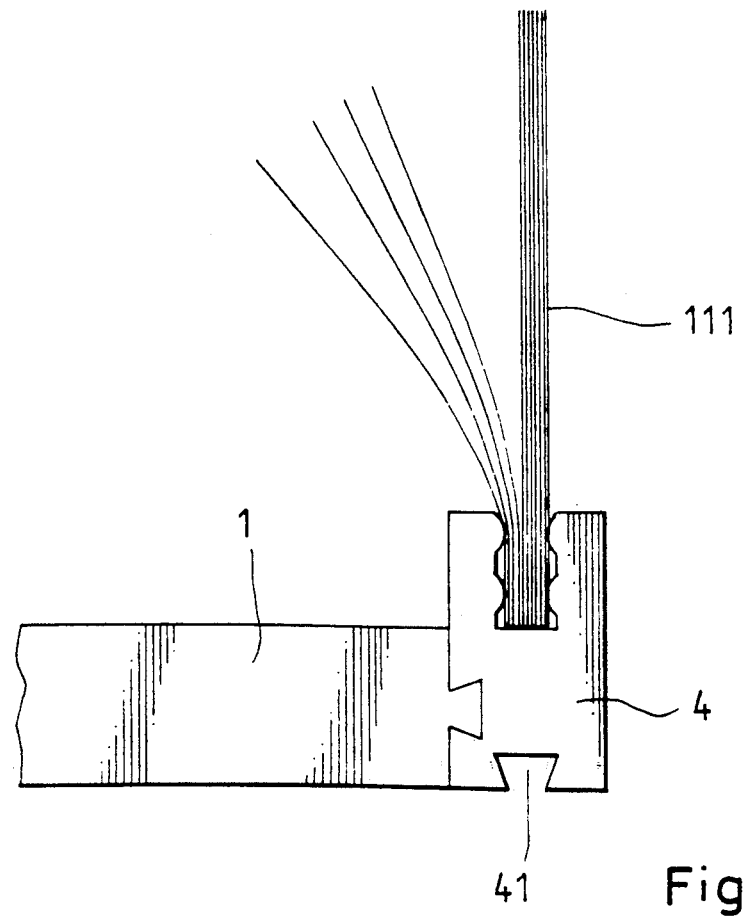
FIG. 14 is a schematic drawing, illustrating the use of a dovetail grooved clamping member for holding sheets of reference paper.

3. A dovetail grooved connecting member 4 can be used to clamp books, reference paper, pamphlets or brochures can be mounted. As illustrated in FIG. 14, a basic solderless circuit board 1 is horizontally connected to a dovetail grooved connecting member 4 in which several sheets of reference paper 111 are mounted vertically.

4. A specially designed circuit may be set in a basic solderless circuit board to form a specific functional board. Thus, several functional boards in accordance with the present invention can be connected horizontally as well as vertically by means of the use of double-sided connecting members, four-sided connecting members or dovetail grooved connecting members.

Figure 10:
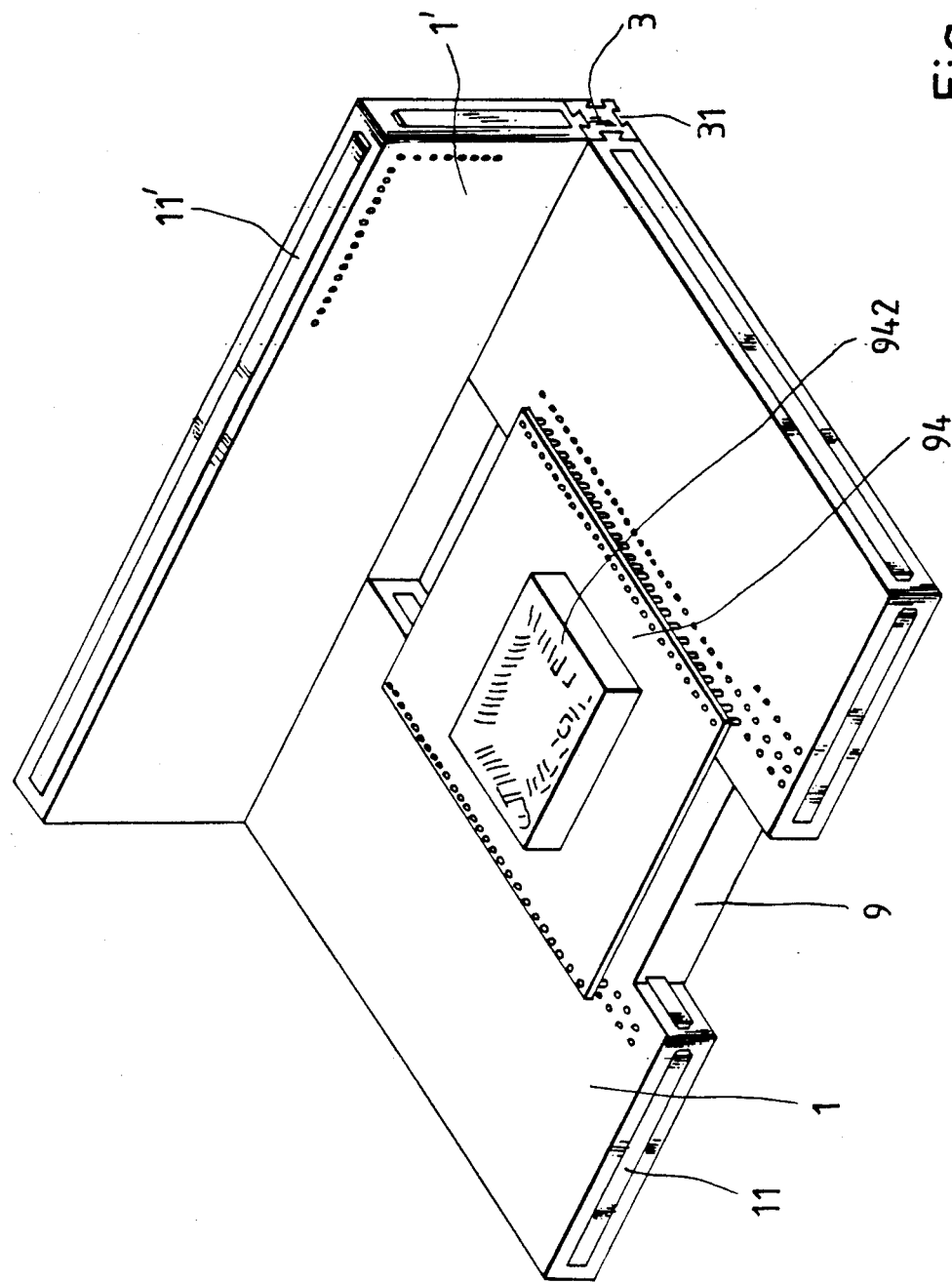
FIG. 10 illustrates a circuit board assembly according to the present invention, in which a circuit board of plastic leaded chip carrier intergrated circuit is mounted on two basic solderless circuit boards above a functional board.

5. The flexibility of the present invention in assembly permits the mounting of certain special electronic components for special test or experimentation. When two electronic components are to be mounted on a board at a range within 2.54 mm (the standard range between pins of an intergrated circuit), a conventional solderless circuit board becomes useless (the range between terminal slots is commonly 2.54 mm). As shown in FIG. 10-1, special electronic components 841 are mounted on a circuit board 94 which is received in a functional board 9 according to the present invention for application. Further, for the installation of some special intergrated circuit such as plastic leaded chip carrier type of intergrated circuit, the space of a conventional solderless circuit board may be fully occupies to interfere with test or experimentation. This problem can be easily solved according to the present invention. As illustrated in FIG. 10, a functional board 9 in accordance with the present invention is secured in between two basic solderless circuit boards 1, 1' of the present invention, and plastic leaded chip carrier type of integrated circuit 942 is welded to a printed circuit board 94 which bridges over the two basic solderless circuit boards 1, 1' above the functional board 9. Thus, sufficient space is provided for proceeding experimentation. As previously described, a dovetail grooved connecting member 4 can be attached to either of the basic solderless circuit boards 1, 1' in the embodiment of FIG. 10 for holding explanatory cards, reference sheets or some other data sheets to help one learn the design.

Figure 11:
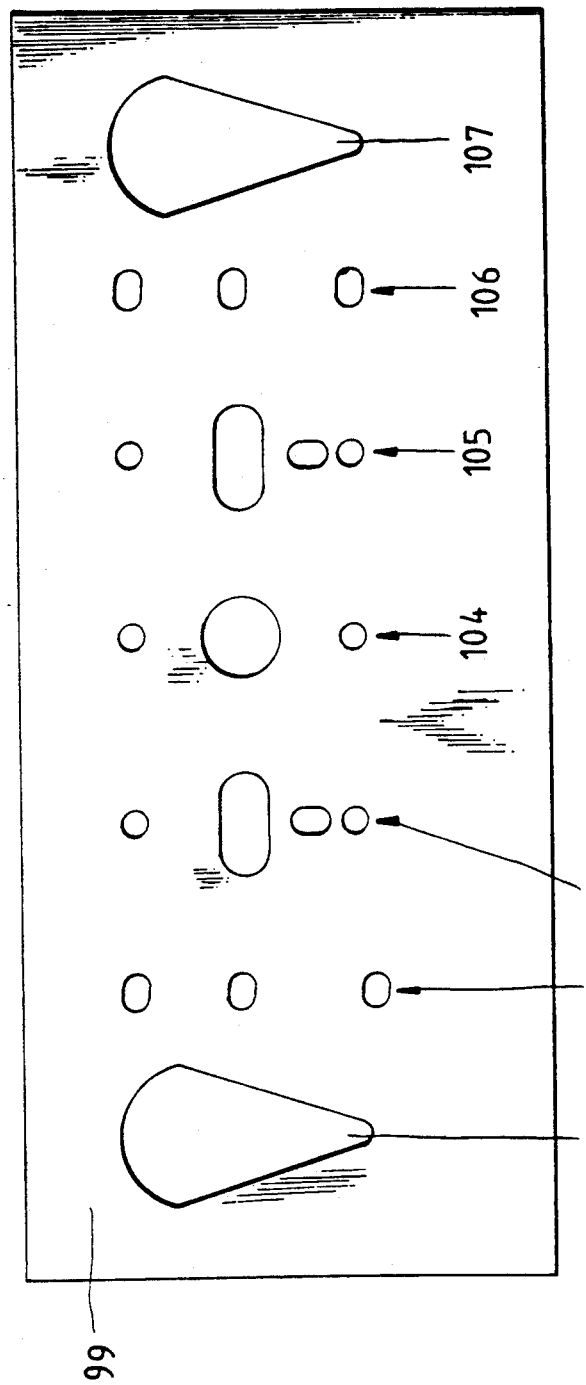
FIG. 11 is a plan view of a component card.

6. Component cards for holding electronic components can be used to match with the present invention. In addition to holding printed circuit boards 61, the corrugated holes 44 of a dovetail grooved clamping member 4 can also be used for holding special component cards. Different component cards may be used for holding different electronic components. FIG. 11 illustrates a component card 99 for holding electronic components, in which 101 and 107 are for holding toggle switches, push button switches, direct current jacks, phone jacks, light emitting diode indicators, audio or video parts, variable resistors, binding posts, banana jacks, fuse holders, rotary switches or RCA jacks . . . etc., 102 and 106 are for holding heat sinks, buzzers, sensors, small power transistors, voltage regulators, intergrated circuit amplifiers, terminals or bridge rectifiers . . . etc.; 103 and 105 are for holding power transistors, triacs or silicon controlled rectifiers . . . etc.; and 104 is for holding power rectifiers, BNC connectors or push spring switches . . . etc. The component card has a raised dovetail strip each on its four vertical sides to connect the said double-sided connecting member and four-sided connecting member for flexibly assembly.

Figures 1, 12:
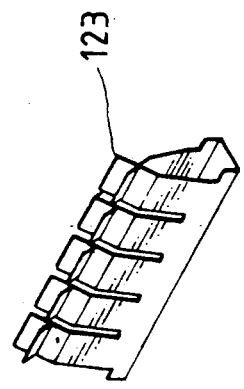
FIG. 12 is a schematic drawing, in which a plug pin of a terminal is inserted in a printed circuit board.
Figure 12:
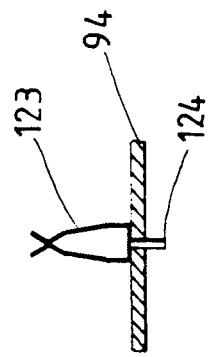

7. A basic solderless circuit board 1 of the present invention can be plugged in a printed circuit board 94. As an alternate form of the present invention, each terminal or some of the terminals 123 of a basic solderless circuit board 1 has an unitary plug pin 124 projecting outward for fastening in a printed circuit board (see FIGS. 12 and 12-1).

8. The present invention is compatible with a variety of interface cards or peripheral equipment, by means of the use of a variety of connectors, to perform a variety of functions including:

(A) Computer network on-line teaching program, teaching program on the air, or test contents and information exchange through modem and other computer hardware/software.

(B) Storage function: For example, to store test contents or result in hard disk drive, floppy disk drive or floppy disk.

(C) Printing function: Test contents or result can be printed through printer.

(D) Drawing analysis function: For example, user can understand point to point of a circuit diagram through combination connector and interface card (for example, logic analysis card).

Figure 13:
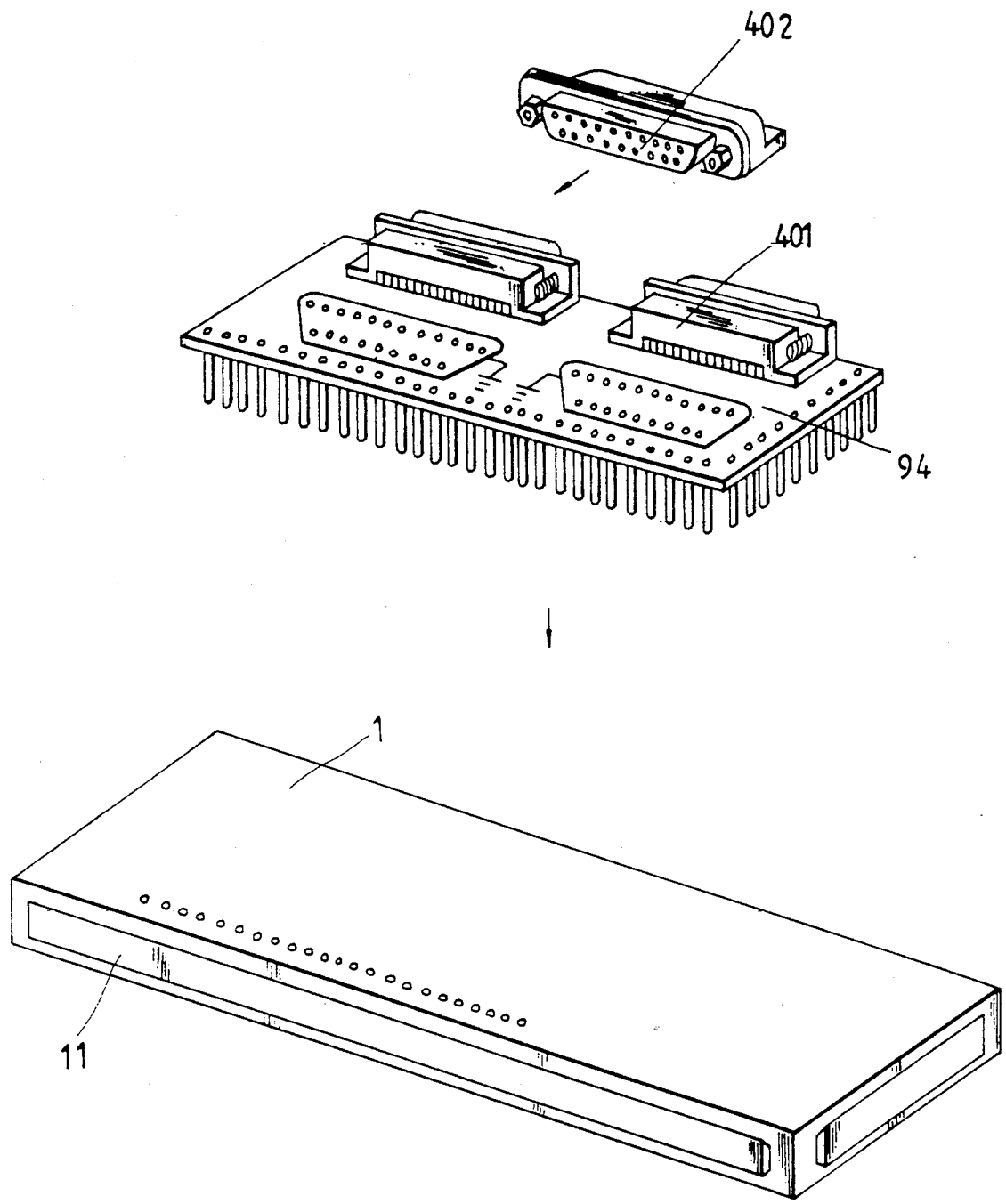
FIG. 13 is a schematic drawing, illustrating the connection of a basic solderless circuit board to a computer connector via a connector on a printed circuit board.
Figures 1, 10:
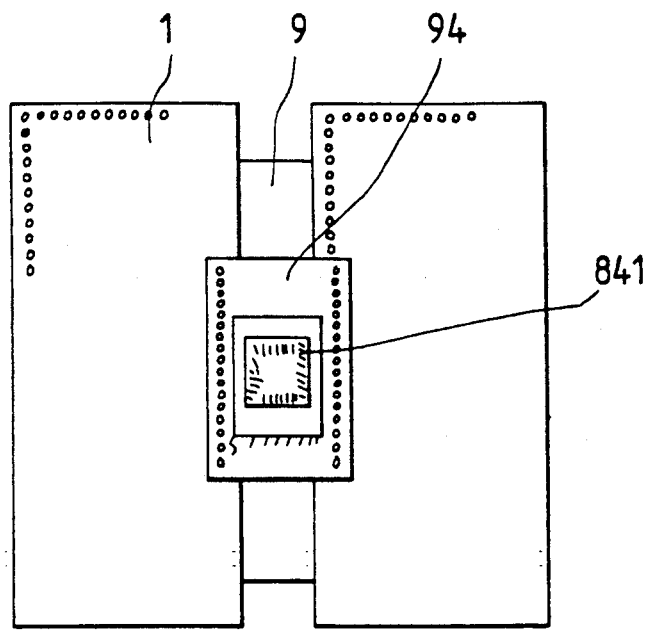

(E) Repair and trouble shooting function: Through a functional board (for example, which contains therein a logic testing probe circuit), when a pin of an intergrated circuit on a computer interface card fails to work properly, it can be immediate detected and repaired. As shown in FIG. 13, a cable connector 401 from a computer or other peripheral equipment can be connected to a connector 402 on a printed circuit board 94 which is mounted on a basic solderless circuit board 1 of the present invention.

As described above, a circuit board assembly of the present invention can be variously embodied by means of the use of a variety of basic solderless circuit boards, double-sided connecting members, four-sided connecting members, dovetail grooved clamping members, functional boards, cards and printed circuit boards. In general, a circuit board assembly according to the present invention has numerous features each of which tends to make the structure more simple and practical in use.

I claim:

1. A circuit board assembly comprising, a basic solderless circuit board of generally rectangular configuration including opposite faces and four elongated sides extending between said faces, each of said sides on the basic solderless circuit board having a length and a width and having an elongated projection extending outwardly thereof and extending along the length of the associated side, each projection having a generally dovetail cross-sectional configuration, a connector means for connecting said basic solderless circuit board with further means, said connector means having a plurality of sides, one of said sides of the connector means having an elongated groove formed therein of generally dovetail cross-sectional configuration complementary to the configuration of said elongated projections and receiving one of said elongated projections, another of said sides of the connector means having a further groove formed therein, and further means supported in said further groove for supporting said basic solderless circuit board and said further means in a predetermined position relative to one another.

2. An assembly as defined in claim 1 wherein said another side of said connector means is disposed substantially parallel with said one side thereof, said further groove having a configuration similar to said elongated groove.

3. An assembly as defined in claim 1 wherein said connector means includes four sides extending substantially at right angles to one another, all of the grooves in the connector means being of similar configuration.

4. An assembly as defined in claim 1 wherein said further groove is a corrugated groove.

5. An assembly as defined in claim 4 wherein said connector means includes another corrugated groove in said another side of the connector means, said corrugated grooves being spaced from one another.

6. An assembly as defined in claim 5 including an opening formed in said another side of the connector means between said grooves so that said corrugated grooves comprise resilient clamping means.

7. An assembly as defined in claim 4 wherein said connector means includes a third side and a fourth side, dowel means projecting from said third side, and dowel holes being formed in said fourth side for receiving dowel means on an adjacent connector means.

8. An assembly as defined in claim 4 wherein said further means comprises a printed circuit board.

9. An assembly as defined in claim 4 wherein said further means comprises a component card for supporting electronic components.

10. An assembly as defined in claim 4 wherein said further means comprises an explanatory card including indicia thereon to assist in logic training or experimentation.

11. An assembly as defined in claim 4 wherein said further means comprises sheets of reference paper.

12. An assembly as defined in claim 1 wherein said further means comprises a component card, said component card including four sides, each of said sides on the component card having an elongated projection extending outwardly thereof, the projection on each of said sides of the component card having a generally dovetail cross-sectional configuration.

13. An assembly as defined in claim 1 including an explanatory card fastened to said basic solderless circuit board, said explanatory card including indicia thereon to assist in logic training or extermination.

14. An assembly as defined in claim 1 wherein said basic solderless circuit board has supported thereon a printed circuit board to serve as a functional board.

15. An assembly as defined in claim 9 wherein said further means comprises another basic solderless circuit board.

16. An assembly as defined in claim 1 wherein said basic solderless circuit board includes a plurality of terminals, at least one of said terminals comprises a unitary plug pin for plugging into a printed circuit board.

* * * * *